INVENTOR
ALBERT W. ZEMEK

Fidelman, Wolffe & Leitner
ATTORNEYS

STRAIGHTENER ASSEMBLY INCLUDING INTEGRATED PRE-STRAIGHTENER FOR ELECTRONIC COMPONENT LEADS

Filed Aug. 26, 1968 2 Sheets-Sheet 2

INVENTOR
ALBERT W. ZEMEK

Seidelman, Wolffe & Leitner
ATTORNEYS

United States Patent Office 3,520,336
Patented July 14, 1970

3,520,336

STRAIGHTENER ASSEMBLY INCLUDING INTEGRATED PRE-STRAIGHTENER FOR ELECTRONIC COMPONENT LEADS

Albert W. Zemek, Binghamton, N.Y., assignor to Universal Instruments Corporation, Binghamton, N.Y., a corporation of New York Filed Aug. 26, 1968, Ser. No. 755,172
Int. Cl. B21f 1/02
U.S. Cl. 140—147 12 Claims

ABSTRACT OF THE DISCLOSURE

A straightening apparatus for electronic component leads including two facing die tools, the first die tool comprising interleaved forming blades and combing blades with inclined surfaces facing said second die tool, the second die tool comprising forming blades and prestraightener blades, said prestraightener blades being pivotably mounted in said second die tool, whereby upon movement of said die tools toward each other said prestraightener serves to guide the leads of the component between the combs, said prestraightener riding up the inclined faces of said combs thereby permitting interaction of the die tool forming blades on the leads.

The present invention relates to an apparatus for straightening the leads of electrical components and more particularly to a lead straightener for components having at least one and generally a plurality of leads extending from a face thereof. Specifically, this invention relates to a lead straightener which in a single power stroke precombs and straightens multiple lead components.

The problems of straightening lead wires in electronic components has led to numerous solutions involving sophisticated equipment which perform the requisite task. Initially, the industry turned to lead combing with insertion into a die block as described in the Zimmerman et al. U.S. Pat. No. 3,122,179, but this required an insertion step with consequent alignment problems. This situation was to a degree rectified by use of a prestraightener combing device either on the die block inserter or as a separate unit, but such proved too cumbersome in the former and involved both an additional power stroke and the possibility of damage between operating stations in the latter. More recently, straighteners have been utilized that used a straightener assembly that divided and straightened the leads in a single or combing stroke as described in the Cole U.S. Pat. 3,144,889 and the Ackerman et al. U.S. Pat. 3,254,821. These devices proved quite effective for relatively short lead straightening since no matter how twisted the leads, they were relatively straight at their juncture with the transistor body and could be divided and trimmed in close proximity thereto without the possibility of a severely bent lead jamming the lead straightening mechanism by substantially overlying the path of the lead dividers.

With the advent of taping of transistors for feeding to automatic insertion equipment, it has now become essential that long leads be permitted on such components for this newly proposed technique of insertion involves the utilization of generally similar equipment as that described in the Alderman et al. Pat. 2,896,208 with appropriate modification made for the extra lead. The transistor is prepared by bending two of its three leads at 90° to the transistor body with the other lead bent 90° in the opposite direction. These components can then be taped in a similar manner to diodes as disclosed in the Wilson et al. U.S. Pat. 3,073,446.

The lead straightening of these type leads was initially attempted with merely extending the lead straightening surfaces of the previously noted apparatus of Cole with a resultant configuration and size being similar to that described in FIGS. 3 and 5 of the Zemek U.S. Pat. 3,344,816, except for the addition of a fourth lead combing blade with a third forming blade. However, the problem of severely bent leads once again presented itself in view of the lead lengths, some leads being so distorted as to be caught between edge of the forming blade and the combing tool and severed during the intermeshing thereof. Once again it became necessary to consider prestraightening with its consequent problems of additional complicating mechanism or separate component processing means. This problem became evermore acute because of space limitations; the straightening generally being carried out as a single station on a transfer assembly such as that described in the Zemek U.S. Pat. 3,333,673, with any additional station requiring a substantial increase in the transfer apparatus length. Even when the prestraightened and straightened units were combined the operating mechanism became so cumbersome that it was difficult to fit into the transfer apparatus with the requisite sequencing of operations causing both mechanical and control problems.

Therefore, it is an object of the present invention to provide a lead straightener for multi-lead transistor type components which operate simply and efficiently.

It is a more specific object of the instant invention to provide a lead straightening mechanism which does not require separate power cycles or apparatus for prestraightening.

It is still a further object of this invention to provide a lead straightener for transistors and the like which may be easily installed on existing equipment without modification of the latter.

It is another object of this invention to provide a lead straightener for transistor leads which will be effective when utilized for straightening substantially any lead length.

Other objects and the nature and advantages of the present invention will be apparent from the following description when taken in conjunction with the accompanying drawing, wherein.

Figures 1, 2, 7, 8, 9:
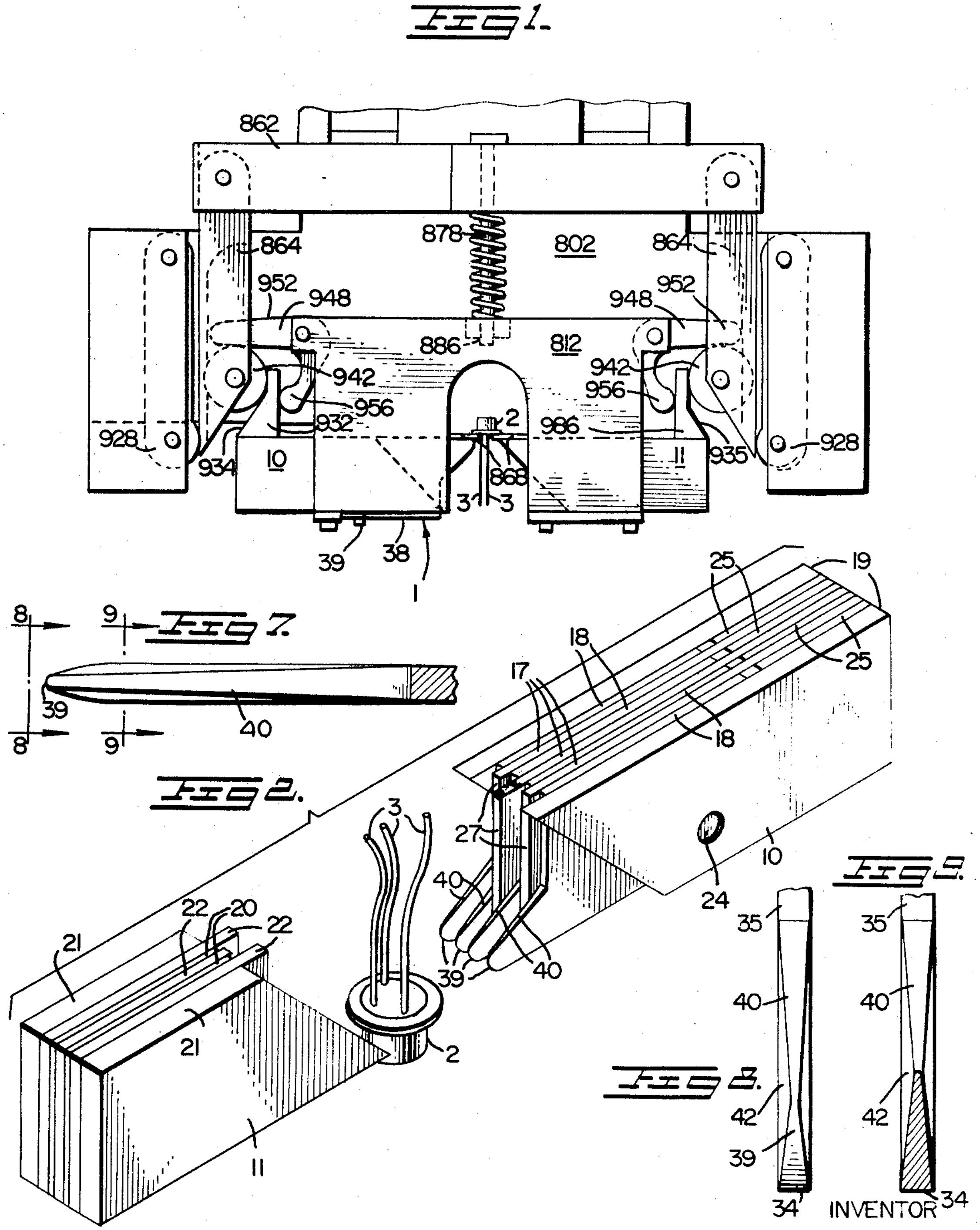
FIG. 1 is a top elevational view of a transistor lead straightener similar to that disclosed in U.S. Pat. 3,344,816 modified to include the prestraightening and straightening elements of the instant invention.
FIG. 2 is a perspective view of the die tool pair utilized in the apparatus of FIG. 1.
FIG. 7 is an enlarged top fragmentary view of the front of the prestraightened blade.
FIG. 8 is a front view of the straightener blade along the line 8—8 of FIG. 7.
FIG. 9 is a sectional view of the straightener blade taken along the line 9—9 of FIG. 7.

The lead straightener of the instant invention generally designated 1 is shown in FIG. 1 incorporated into the apparatus shown in FIGS. 11 and 13 of U.S. Pat. 3,344,816 and described briefly therein. Such apparatus is also found in modified form in the Ackerman et al. Pat. 3,254,821, FIGS. 2, and 27–37. In order for the reader to understand the coaction of parts without reference to these patents, a brief description thereof follows. All substantially identical parts will have the same reference numerals as shown in FIG. 11 of Pat. 3,344,816. It is to be recognized that the lead straightening concepts herein described can be used with equal advantage in other lead straightening apparatus such as those specifically shown in FIGS. 2, 3, 5 and 8–10 of U.S. Pat. 3,344,816. Furthermore, although the components are shown held in the lead guide mechanism of Pat. 3,254,821, they could equally satisfactorily be held in other mechanisms such as the feeding apparatus of the Zemek Pat. 3,333,673 or the rotary transistor assembly shown in FIGS. 1, 2 and 3 of Pat. 3,344,816.

As shown in FIG. 1 a transistor 2 having leads 3 is driven on a guide chute 868 into the tool holder 812′ past the mounting plate (only partially shown) 802 (and is positioned by a meter wheel 892 or escapement blade 1121, not shown, as described in Pat. 3,254,821).

Straightening die tools 10 and 11 have attached tool heads 932 and 936, respectively, and these combinations are slidably held in tool holder 812′. The die tools are actuated to intermeshing relation by bar 862 which when moved toward said tool holder by a slave cylinder (not shown) causes actuating levers 864, backed up by adjustably positioned rollers 928, to move toward said die tools. Journalled rollers 942 on said actuating levers 864 abut inclined cam surfaces 934 and 935 on tool heads 932 and 986, respectively, to cam the tools into meshing position to process the transistor lead. Cam surface 934 is so positioned with respect to cam surface 935 that straightening tool 10 is moved toward the transistor before straightening tool 11. Simultaneously with the action of the die tools, a damping tip 886 presses down on the top of the body of the transistor under the urging of a rod 878 yieldably mounted through the bar 862.

The straightening tools are separated when the slave cylinder retracts the bar 862 and the actuating levers 864 move away from the tools. The rollers 942 each abut an arm 952 of a bell crank 948 to cause a second arm 956 of the crank 948, lying adjacent the inner vertical edge of the respective tool heads 932 and 986 to drive straightening tools 10 and 11 out of mesh and freeing the processed leads.

Referring to FIG. 2, the straightening die tools 10 and 11 are so constructed as to intermesh and to form three composite circular passages for the transistor leads. For further identification straightening die tool 10 will be designated as the right die tool and tool 11 will be designated as the left die tool. The right die tool 10 is constructed in sandwich fashion of interleaved forming blades 17 and prestraightener blades 18 and includes a stop plate 19 on either side of the sandwich. The left die tool 11 is also constructed in sandwich fashion and includes inner combing blades 20, outer combing blades 21 with forming blades 22 therebetween.

The elements of the left die tool are completely rigid while in the right only the prestraighteners 18 are movable. This is permitted by mounting the prestraighteners 18 on pin 24 which passes through the right die block 10. The overall rigidity of the right die tool is maintained by securing back spacer plates 25 in between the forming blades 17 and stop plates 19. A small gap 26 (FIG. 3) is provided between each prestraightener and its back spacer plate 25 to allow rotational movement of the former.

Figure 3:
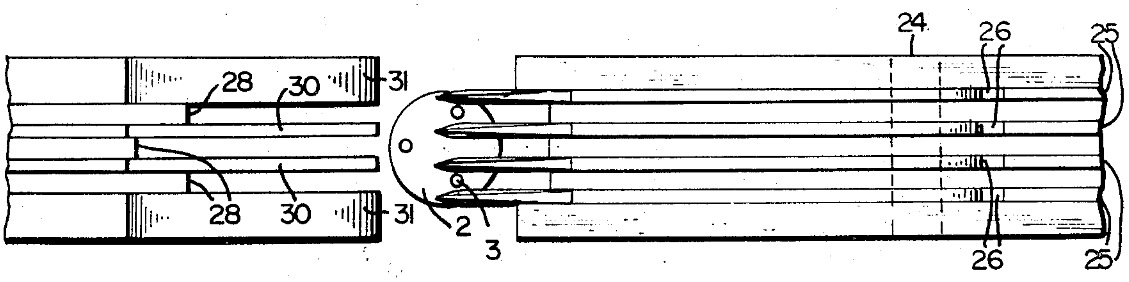
FIG. 3 is a top view of the die tool pair of FIG. 2 showing the prestraighteners initially dividing the leads.
Figure 5:
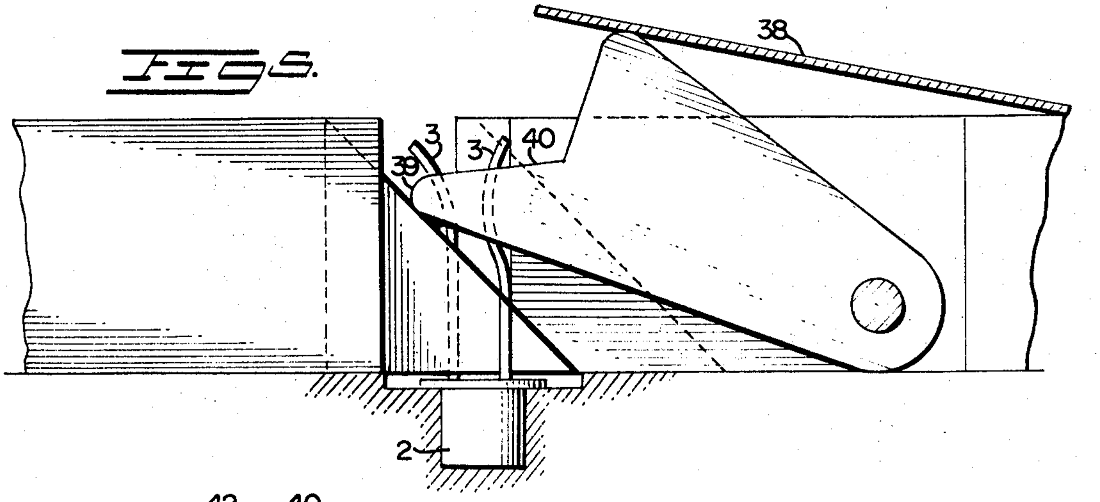

The forming blades 17 each include a working face 27 and the forming blades 22 each include a working face 28 (FIG. 3). Each of these faces are substantially planar from top to bottom and may be concave or center depressed as in Pat. 3,344,818 (FIGS. 3 and 5). Alternatively, when two units are to be used in sequence, the working faces of the forming blades of the first may be in the ripple pattern as described as shown in Pat. 3,344,816. The forming blades 17 and 22 are so positioned in their respective die tools that when the two straightening tools are moved together, an exact 3 lead hole pattern is established. This is accomplished, as shown in FIGS. 2 and 3, by having two of the working faces of the forming blades of the left die tool protrude from the plane of the third and only one of the working faces of the forming blades of the right tool protrude. Both the inner and outer combing blades in the left die are provided with inclined faces 30 and 31, respectively, while the stop plates 19 are provided with reverse inclined faces 50 which are so arranged as to exactly overlap a portion of the inclined surfaces 31 of the outer combing blades 21 on the left die tool when the latter is meshed with the right die block. Although the drawing shows a straight line incline, curvature thereof is possible. Specifically, surfaces 30 and 31 may be concave while 50 could be convex. The combined thickness of the stop plate 19 and a prestraightening blade 18 is substantially the same as that of the outer combing blade for reasons explained later.

The prestraighteners 18 are of basically triangular configuration and include (FIGS. 4–6) an inclined top surface 33, a horizontal base surface 34 and a vertical front surface 35. The top and base surfaces are connected by an arcuate surface 36 which allows the prestraightener to pivot around pin 24 upon which it freely rides without hitting back spacer plate 25. The vertical front surface is connected to the top surface by a short arcuate surface 37 which makes contact with a spring 38 (FIG. 1) mounted on the right die tool by bolt 39 so as to urge the prestraightener into the positions shown in FIGS. 1, 2 and 4. The base of the prestraightener extends outwardly from the front surface to form a blade 42 which includes an arcuate lead separating blade surface 39 at its extremity and an upwardly inclined surface 40 connecting the arcuate surface 39 to the front surface 35. As shown and the enlarged front and sectional views of FIGS. 8 and 9, the blade section 42 of the prestraightener is substantially thinned toward the surface 39 in order to insure lead division, but widens to substantially full width before the base surface begins.

Figure 6:
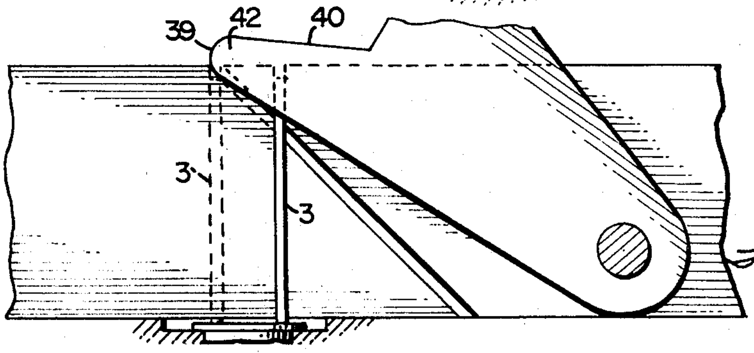

As shown in FIGS. 3, 5 and 6 the prestraighteners are so aligned that upon mating of the left and right die block the arcuate surfaces 39 contact the inclined surfaces 30 and 31 of the inner or outer combing blades, respectively, and travel thereon; the pin 24 allowing the prestraightener to pivot in a clockwise direction as the blades travel up the inclined surfaces.

Figure 4:
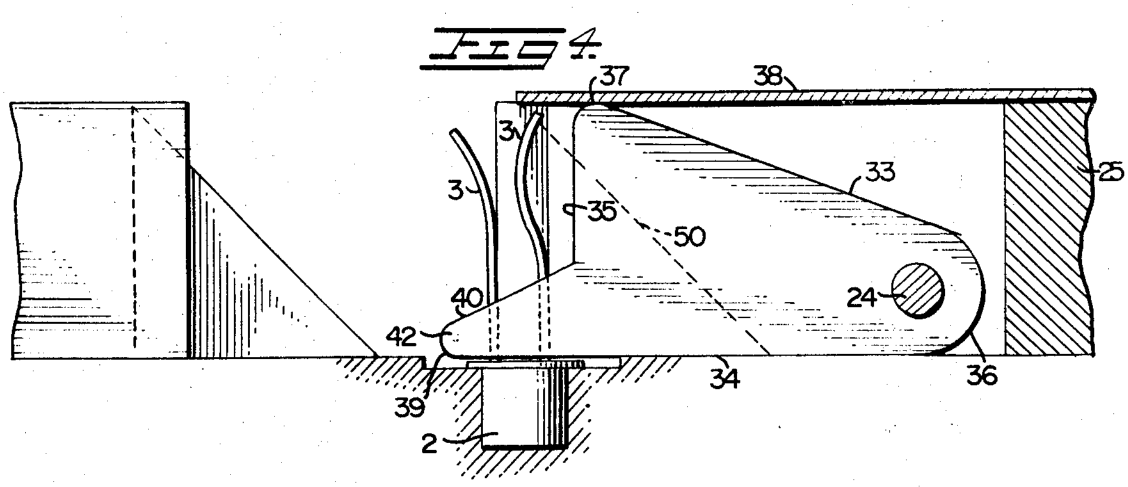
FIGS. 4–6 illustrate the operation and positioning of the prestraightener during the movement of the die tools to final lead straightening position.

In operation upon actuation of the slave cylinder, the sole power source for this apparatus, the right die tool is first moved toward the transistor leads, the prestraightener blades knifing between the leads, as shown in FIGS. 3 and 4 initially at a point near their connection with the transistor body. As the right die tool continues to move toward the transistor, more lead length is covered by the blade section 42 of the prestraightener. After initial separation by the right die tool, the left die tool is actuated, moving toward the right. This movement brings the forward arc portion of the blade section 12 of the prestraightener into contact with the inclined surfaces of the 30 and 31 of the inner and outer combing blades. As the prestraighteners ride up these inclines, the full length of the leads of the transistor are straightened, the portions previously prestraightened being held in the gaps between the combing blades (FIG. 5), the prestraightening is complete when the prestraightener blades have ridden all the way up the inclined faces of the combs and the forming blade faces 27 and 28 have abutted against the leads. The travel of the die tools is controlled by the cam faces and the stop plates, the latter insuring that the forming blades do not crush the leads. Upon retraction of the die tools, the prestraighteners ride back down the inclines of the combs under the urging of the spring 38.

While the foregoing specification illustrates and describes what I now contemplate to be the best mode of carrying out my invention, the construction is, of course, subject to modification without departing from the spirit and scope of my invention. It is apparent that numerous alternative arrangements may be constructed utilizing the above-described technique. For example, it is not necessary that the die tools act in any sequential manner, appropriate spacing thereof allowing both tools to be actuated simultaneously. Similarly, the principles of prestraightening can be applied to one or two lead devices as shown in FIGS. 3 and 5 of Pat. 3,344,816, or, with appropriate precision, to four lead components, this latter effect being possible by holding the component so that no two leads are directly behind one another in the path of the die tools. Therefore, I do not desire to restrict the invention to the particular form of construction illustrated and described, but desire to cover all modifications that may fall within the scope of the appended claims.

What is claimed is:

1. A lead straightener assembly for electronic components having a body portion and at least one lead extending from a face thereof, said assembly including first and second die tools and means to drive said tools into intermeshing relation, said first die tool comprising interleaved forming and combing members and said second die tool comprising aligned, interleaved forming and prestraightener members, said forming members on said first die tool facing said forming members on said second die tool, each of said combing members or said first die tool including an inclined surface facing a prestraightener member on said second tool, said prestraightener members being pivotably mounted and adapted to ride up the inclined surfaces of said combing members when said die tools are intermeshed whereby the leads of said component are prestraightened and held between said combs before being acted on by the interaction of said forming members.

2. The lead straightener of claim 1 wherein each prestraightener includes a protruding blade portion, said blade including a narrow front edge adapted to slide between the leads of said component.

3. The lead straightener of claim 2 wherein the blade portion is of a height substantially less than the component lead length whereby the prestraighteners divide the component leads initially only in the area closest to the component body.

4. The lead straightener of claim 1 which includes resilient means mounted over said second die tool, said means urging said prestraightener into alignment with said forming members, said means further being adapted to permit said prestraightener to ride up said combing members.

5. The lead straightener of claim 4 wherein said second die tool includes outside stop plates having a reverse inclined face to that of said combing members, the width of each outside stop plate and one prestraightener being substantially equal to the width of the outermost combing member on said first die tool.

6. The lead straightener of claim 1 wherein there are three forming members on each die tool, two of the members on each being equally offset from the third, whereby when said die tools are intermeshed a triangular three-hole pattern is obtained.

7. A die combination for use in electronic component lead straightening apparatus comprising first and second die tools, said first die tool comprising interleaved forming and combing members and said second die tool comprising aligned, interleaved forming and prestraightener members, said forming members on said first die tool facing said forming members on said second die tool, each of said combing members or said first die tool including an inclined surface facing a prestraightener member on said second tool, said prestraightener members being pivotably mounted and adapted to ride up the inclined surfaces of said combing members when said die tools are intermeshed whereby the leads of said component are prestraightened and held between said combs before being acted on by the interaction of said forming members.

8. The die combination of claim 7 wherein each prestraightener includes a protruding blade portion said blade including a narrow front edge adapted to slide between the leads of said component.

9. The die combination of claim 8 wherein the blade portion is of a height substantially less than the component lead length whereby the prestraighteners divide the component leads initially only in the area closest to the component body.

10. The die combination of claim 7 which includes resilient means mounted over said second die tool, said means urging said prestraightener into alignment with said forming members, said means further being adapted to permit said prestraightener to ride up said combing members.

11. The die combination of claim 10 wherein said second die tool includes outside stop plates having a reverse inclined face to that of said combing members, the width of each outside stop plate and one prestraightener being substantially equal to the width of the outermost combing member on said first die tool.

12. The die combination of claim 7 wherein there are three forming members on each die tool, two of the members on each die tool, two of the members on each being equally offset from the third, whereby when said die tools are intermeshed a triangular three-hole pattern is obtained.

References Cited

UNITED STATES PATENTS

| | | | |
|---|---|---|---|
| 3,319,668 | 5/1967 | Shambelan | 140—147 |
| 3,344,816 | 10/1967 | Zemek | 140—147 |
| 3,374,809 | 3/1968 | Fleckenstein | 140—147 |

LOWELL A. LARSON, Primary Examiner